United States Patent [19]
Hsu

[11] Patent Number: 5,627,393
[45] Date of Patent: May 6, 1997

[54] VERTICAL CHANNEL DEVICE HAVING BURIED SOURCE

[75] Inventor: Chen-Chung Hsu, Taichung, Taiwan

[73] Assignee: United Microelectronics Corporation, Hsin-Chu, Taiwan

[21] Appl. No.: 512,833

[22] Filed: Aug. 9, 1995

Related U.S. Application Data

[62] Division of Ser. No. 351,492, Dec. 7, 1994, Pat. No. 5,455,190.

[51] Int. Cl.$^6$ .......................... H01L 29/76; H01L 29/74; H01L 31/062; H01L 31/113
[52] U.S. Cl. .......................... 257/331; 257/332; 257/333; 257/343
[58] Field of Search .......................... 257/330, 331, 257/332, 333, 343

[56] References Cited

U.S. PATENT DOCUMENTS

| | | | |
|---|---|---|---|
| 4,791,462 | 12/1988 | Blanchard et al. | |
| 5,164,325 | 11/1992 | Cogan et al. | 437/29 |
| 5,378,914 | 1/1995 | Ohzu et al. | 257/369 |
| 5,473,176 | 12/1995 | Kakumoto | 257/192 |

*Primary Examiner*—Ngân V. Ngô
*Attorney, Agent, or Firm*—William H. Wright; Alan S. Raynes

[57] ABSTRACT

A structure is provided comprising a semiconductor substrate having a first conductivity type, a buried source region having a second opposite conductivity type, and an epitaxial layer of the second conductivity type having a lower dopant concentration than the buried source region. Field oxide regions are formed at outer edges of the epitaxial layer. A well region of first conductivity type is implanted into the central portion of the epitaxial layer to define the active area. Trenches are etched through the well region into the buried source region. A first layer of silicon oxide is grown on the surface and within the trenches. Gate electrodes are formed by depositing a layer of polysilicon and etching back to leave the polysilicon layer only within the trenches. Ions of second conductivity type are implanted into the top portion of the well region to form drain regions. A second layer of silicon oxide is deposited over the top surfaces and planarized. Contact trenches are etched through the second silicon oxide layer and the field oxide regions to connect to the buried source region. A second set of contact trenches are etched through portions of the second silicon oxide layer to the underlying drain regions. A layer of tungsten is deposited and etched back leaving the tungsten within the first and second trenches. Interconnections are made between the source and drain regions to complete the fabrication.

18 Claims, 6 Drawing Sheets

5,627,393

VERTICAL CHANNEL DEVICE HAVING BURIED SOURCE

This Application is a divisional of application Ser. No. 08/351,492 filed Dec. 7, 1994, now U.S. Pat. No. 5,455,190.

BACKGROUND OF THE INVENTION

(1) Field of the Invention

The present invention relates to the fabrication of integrated circuit devices, and more particularly, to a method of making a vertical channel device using buried source techniques to reduce the area of the active region in the fabrication of integrated circuits.

(2) Description of the Prior Art

A priority in integrated circuit chip fabrication technology today is in reducing the chip size. Workers in the art have striven to reduce the width of the polysilicon from 2 µm, 1 µm, 0.8 µm, 0.5 µm, to 0.35 µm, etc. Most of the effort at reducing chip size is directed toward reducing the polysilicon size. At some point in the near future, the polysilicon width shrinkage will have reached its maximum effectiveness. Source and drain regions are planned and drawn at the chip surface, which wastes valuable underlying layout areas. The large field oxide areas are used for isolation only. For example, in FIG. 1, there is shown a portion of a partially completed integrated circuit. Field oxide regions 11 have been formed in and on the surface of the semiconductor substrate 10. Source contacts 20 and drain contacts 22 are shown in a finger-type layout on the surface of the integrated circuit chip. In order to further shrink the chip layout, the source and drain regions must be addressed.

U.S. Pat. No. 5,164,325 to Cogan et al shows the formation of a vertical channel device using a buried source/drain structure.

SUMMARY OF THE INVENTION

Accordingly, it is a primary object of the invention to provide a process for fabricating an integrated circuit device with decreased junction area.

It is another object of the present invention to provide a process for fabricating a vertical channel device integrated circuit.

In accordance with the objects of the invention, a new method of manufacturing a vertical channel device integrated circuit is described. A structure is provided comprising a semiconductor substrate having a first conductivity type, a buried source region having a second conductivity type opposite to the first conductivity type and a first dopant concentration formed on top of the semiconductor substrate, and an epitaxial layer of the second conductivity type having a second dopant concentration formed on the surface of the buried source region wherein the second dopant concentration is less than the first dopant concentration. Field oxide regions are formed in and on the surface of the epitaxial layer on the outer edges of the semiconductor substrate. A well region of first conductivity type is implanted into the epitaxial layer within the central portion of the semiconductor substrate wherein the well region defines the active area of the integrated circuit. Trenches are etched through the well region into the underlying buried source region where the well region is not covered by a mask. A first layer of silicon oxide is thermally grown conformally on the surface of the well region and within the trenches. Gate electrodes are formed by depositing a layer of polysilicon over the surface of the well region and within the trenches and etching back the polysilicon layer leaving the polysilicon layer only within the trenches. The trenches are covered with a photoresist mask. Ions of second conductivity type are implanted into the top portion of the well region not covered by the photoresist mask to form drain regions within the well region. A second layer of silicon oxide is deposited over the surface of the well region and the field oxide regions and planarized. Contact trenches are etched through the second silicon oxide layer and the field oxide regions not covered by a mask to connect to the buried source region. A second set of contact trenches are etched through portions of the second silicon oxide layer not covered by a mask to the underlying drain regions. A layer of tungsten is deposited over the surface of the substrate and within the first and second contact trenches and etched back leaving the tungsten only within the trenches. Interconnections are made between the source and drain regions to complete the fabrication of the vertical channel device in the manufacture of an integrated circuit.

According to the objects of the present invention, a new vertical channel device integrated circuit is described. The device comprises a semiconductor substrate of a first conductivity type, a buried source region having a second conductivity type opposite the first conductivity type formed on top of the semiconductor substrate, an epitaxial layer of the second conductivity type formed overlying the buried source region wherein the epitaxial layer has a dopant concentration less than the dopant concentration of the buried source region, a well region of the first conductivity type formed within the central portion of the epitaxial layer wherein the well region defines the active region of the integrated circuit, field oxide regions formed in and on the outer edges of the epitaxial layer, a top planarized layer of silicon oxide overlying the field oxide regions and the well region, polysilicon-filled trenches extending through the well region and contacting buried source region, drain regions of the second conductivity type within the top surface of the well region and between the polysilicon-filled trenches, first tungsten plug-filled trenches through the planarized silicon oxide layer contacting the drain regions, second tungsten plug-filled trenches through the field oxide regions contacting the buried source region, and interconnections between the source and drain regions.

BRIEF DESCRIPTION OF THE DRAWINGS

In the accompanying drawings forming a material part of this description, there is shown.

DESCRIPTION OF THE PREFERRED EMBODIMENTS

FIGS. 2 through 12 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

Figure 1:
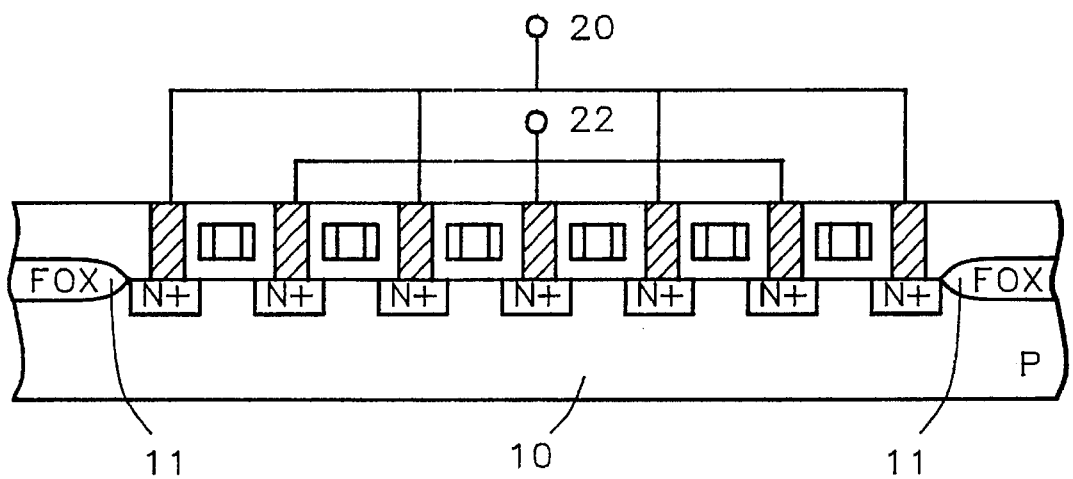
FIG. 1 is a cross-sectional representation of an integrated circuit of the prior art.
Figure 2:
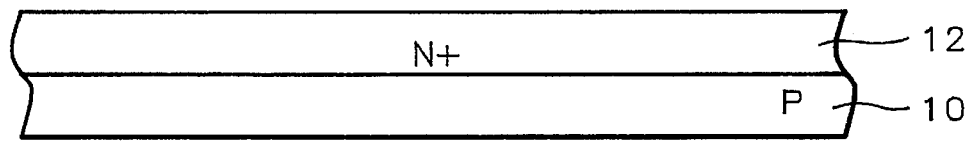
FIGS. 2 through 9 are cross-sectional representations of a preferred embodiment of the present invention.

Referring now more particularly to FIG. 2, there is shown a semiconductor substrate 10, preferably composed of silicon having a (100) crystallographic orientation. For this NMOS illustration, the substrate is a P-substrate or a P-well. First, the buried source region will be formed. Ions are implanted into the top surface of the semiconductor substrate to form the implanted region 12. The buried source region will be of opposite conductivity type from the substrate. For an N+ region, arsenic ions are implanted at a dosage of between about 1 E 15 to 1 E 16 atoms/cm$^2$ at an energy of between about 50 to 100 KeV. For a P+ region (not shown), $BF_2$ ions are implanted at a dosage of between about 1 E 15 to 1 E 16 atoms/cm$^2$ at an energy of between about 50 to 100 KeV.

Figure 3:
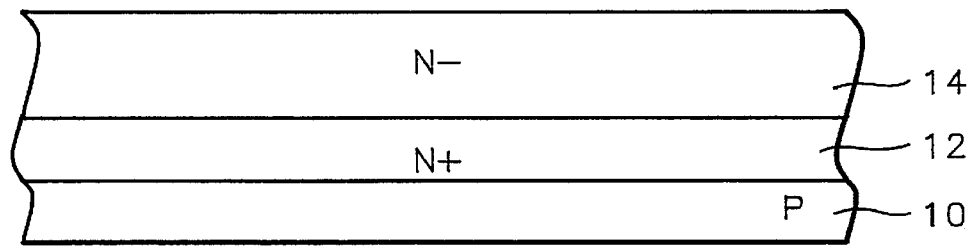

Referring now to FIG. 3, an epitaxial layer 14 is formed by, for example, subjecting the substrate to a flow of $SiH_2Cl_2$-$H_2$-HCl at a temperature of between about 950° to 1080° C. and a pressure of between about 40 to 60 Torr. The epitaxial layer is grown to a thickness of between about 2000 to 4000 Angstroms. The epitaxial layer has the same conductivity type as the buried source layer, but the dopant concentration of the epitaxial layer 14 is between about 1 E 11 to 1 E 12 atoms/cm$^3$, less than the dopant concentration of the buried layer which is between about 1 E 15 to 1 E 16 atoms/cm$^3$.

Figure 4:
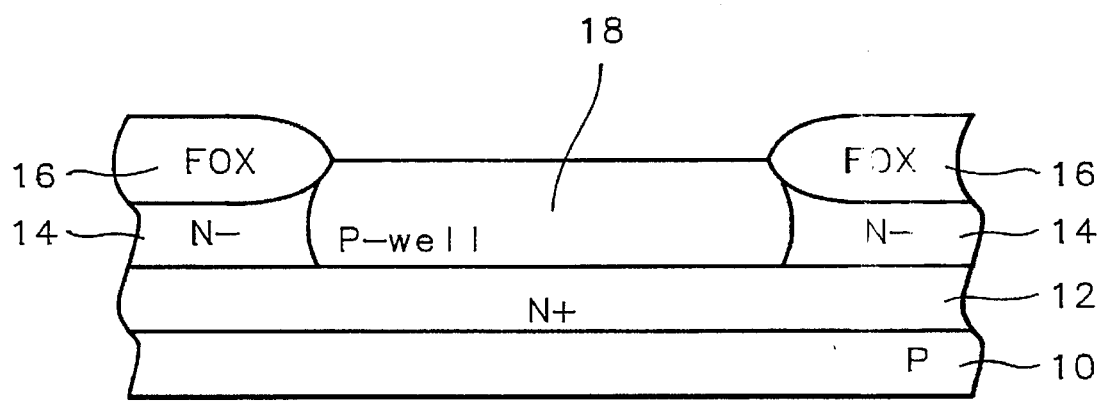

The substrate is oxidized to form field oxide isolation regions 16 on the periphery of the active area. Ions are implanted into the active area to form the well region 18, as shown in FIG. 4. The well region is of the same conductivity as the semiconductor substrate 10. For the NMOS example illustrated, the well region is a P-well, formed by implanting boron ions at a dosage of between about 5 E 12 to 5 E 13 atoms/cm$^2$ and an energy of between about 100 to 200 KeV. An N-well, not shown, would be formed by implanting phosphorus ions at a dosage of between about 1 E 12 to 1 E 13 atoms/cm$^2$ and an energy of between about 100 to 200 KeV.

Figure 5:
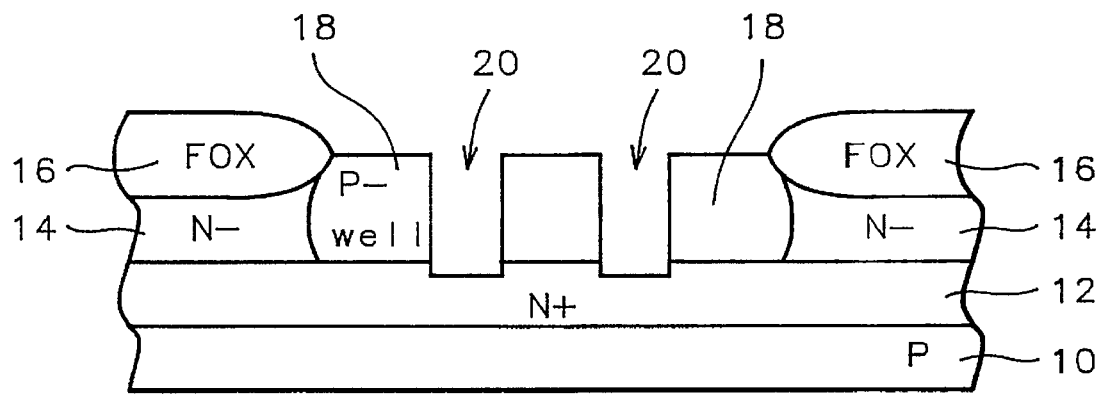

Referring now to FIG. 5, silicon trenches 20 are etched through the well region 18 and into the buried source region 12, using a conventional reactive ion etching ambient.

Figure 6:
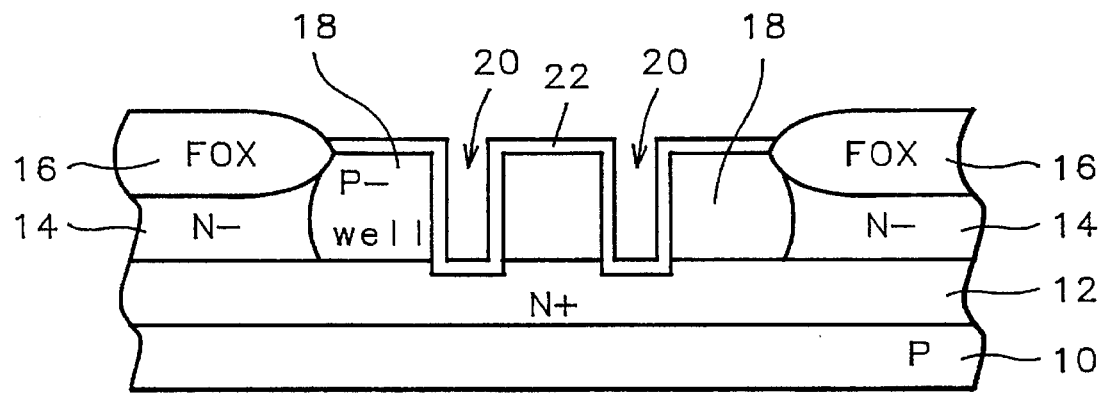
Figure 7:
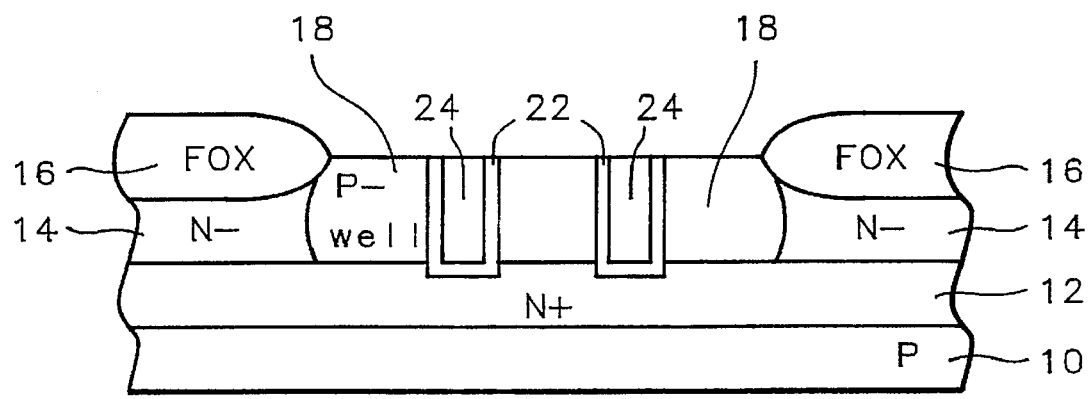

A gate oxide layer 22 is thermally grown conformally on the surface of the well region 18 and within the trenches 20, as illustrated in FIG. 6. A layer of polysilicon is deposited by chemical vapor deposition (CVD) over the surface of the gate oxide layer 22 and within the trenches. The polysilicon is doped as is conventional to form polysilicon gate electrodes 24. The polysilicon and gate oxide layer are etched back leaving the polysilicon only within the trenches as shown in FIG. 7.

Figure 8:
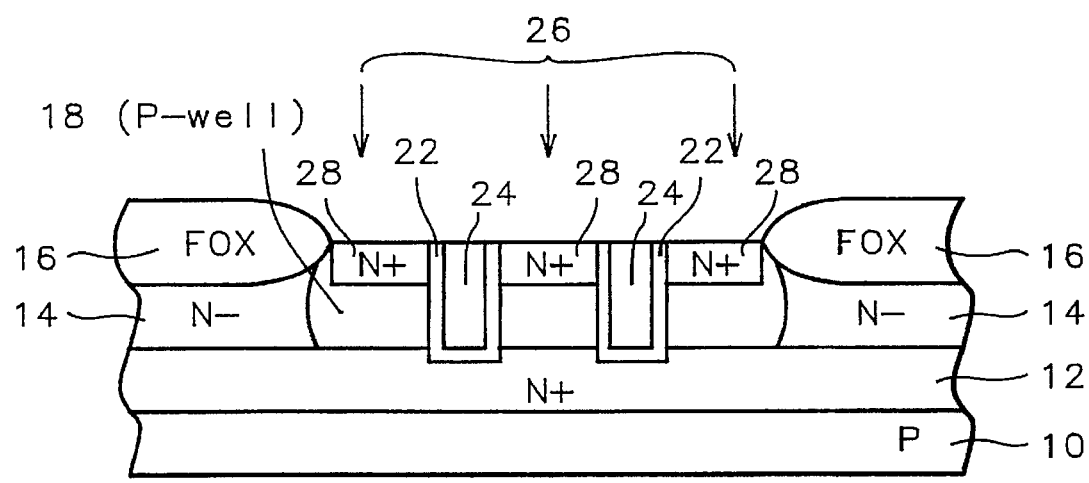

Referring now to FIG. 8, drain regions 28 are formed within the top surface of the well region between the polysilicon gate electrodes. Lithographic masks, not shown, may be required to protect the areas, such as the gate electrodes, not to be subjected to the ion implantation. The formation of the lithographic masks is done by conventional lithography and etching techniques. For the N+ drain implant of the example, arsenic ions 26 are implanted at a dosage of between about 1 E 15 to 1 E 16 atoms/cm$^2$ and energy of between about 50 to 100 KeV. For a P+ drain implantation, not shown, $BF_2$ ions are implanted at a dosage of between about 1 E 15 to 1 E 16 atoms/cm$^2$ and energy of between about 50 to 100 KeV.

Figure 9:
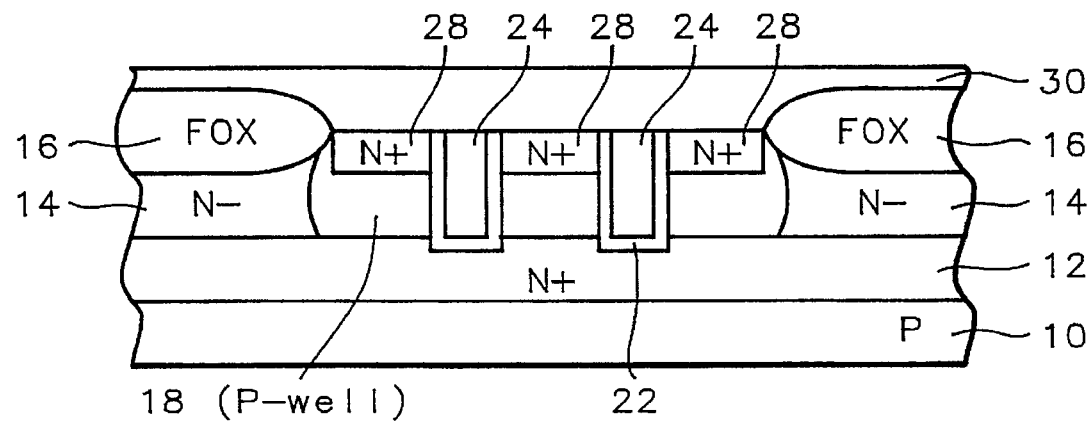

Referring now to FIG. 9, a layer of silicon dioxide 30 is deposited by CVD over the surface of the substrate and planarized. The connection to the buried source region will now be described. Two alternative methods may be used to accomplish the connection. The first method is illustrated by FIGS. 10A and 10B.

Figure 10A:
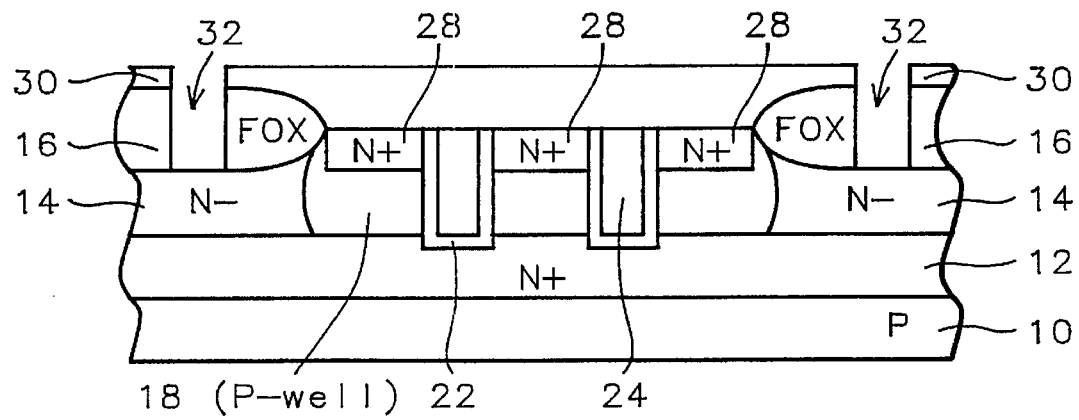
FIGS. 10A and 10B are cross-sectional representations of a first preferred embodiment of the present invention.
Figure 10B:
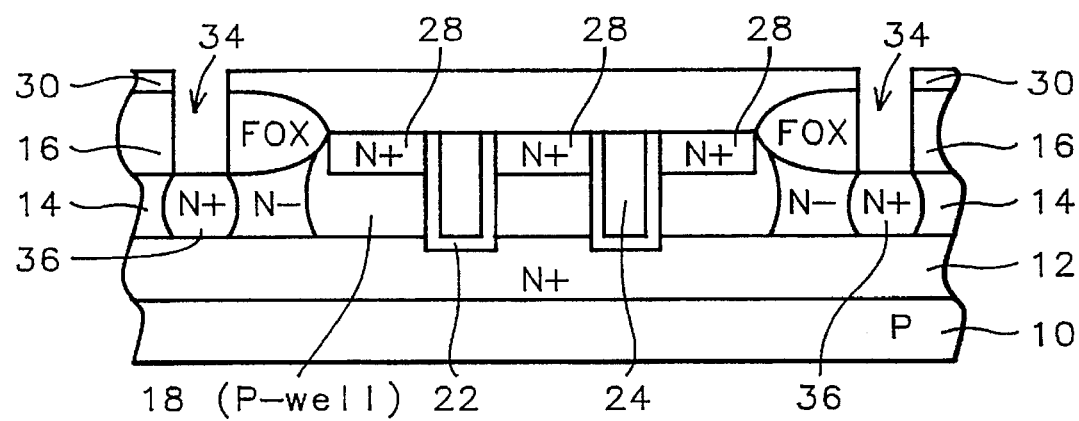

Referring now to FIG. 10A, trenches 32 are etched through the field oxide regions 16 to the underlying epitaxial layer 14. Referring to FIG. 10B, ions 34 are implanted through the trenches 32 into the epitaxial layer to form heavily doped region 36 of the same dopant concentration as the underlying buried source region. The implant then is driven in to provide connection to the buried source region. For the NMOS example illustrated, phosphorus ions are implanted with a dosage of between about 5 E 15 to 5 E 16 atoms/cm$^2$ and energy of between about 100 to 200 KeV. For a PMOS integrated circuit device, not shown, $BF_2$ ions are implanted with a dosage of between about 5 E 15 to 5 E 16 atoms/cm$^2$ and energy of between about 100 to 200 KeV.

Figure 10C:
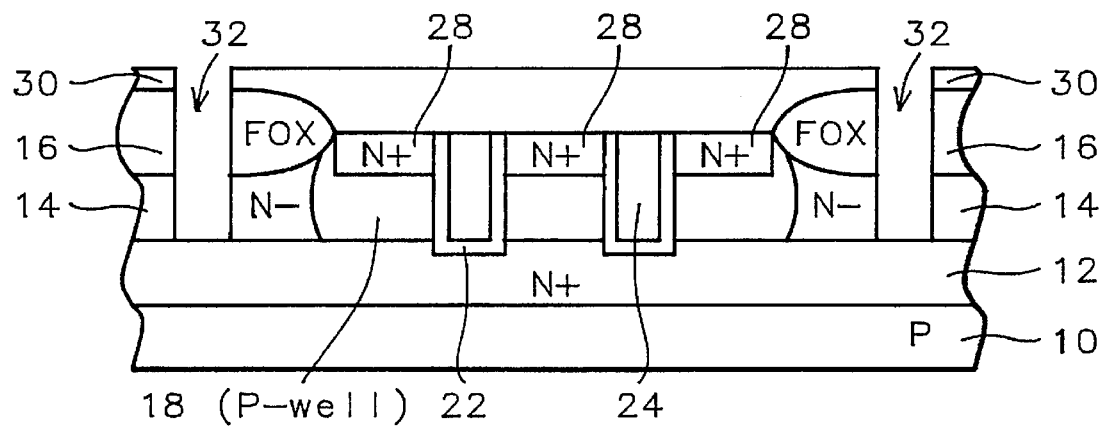
FIG. 10C is a cross-sectional representation of a second preferred embodiment of the present invention.

Alternatively, as illustrated in FIG. 10C, trenches 32 are etched through the field oxide regions 16 and the underlying epitaxial layer 14 to the buried source region 12. With this alternative, the trench makes a direct connection to the buried source region so that an additional implant is unnecessary. The first alternative is illustrated in the remaining figures, although processing is the same for both alternatives.

Figure 11:
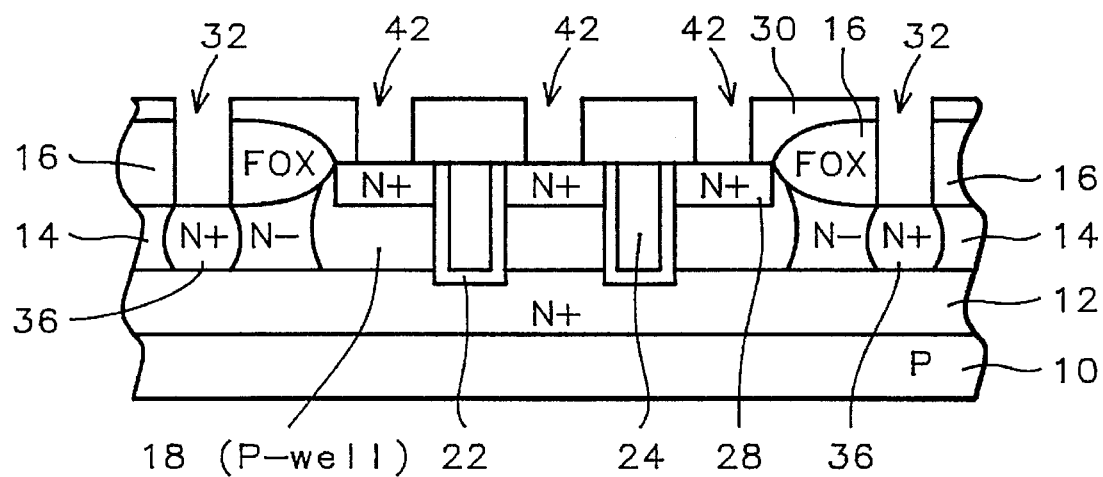
FIG. 11 is a cross-sectional representation of a preferred embodiment of the present invention.

Referring now to FIG. 11, connection to the drain regions is now made. The source and drain contact etching must be performed with separate etching masks because of the differing depths of the contacts. Trenches 42 are etched through the silicon dioxide layer 30 to the drain regions 28.

Figure 12A:
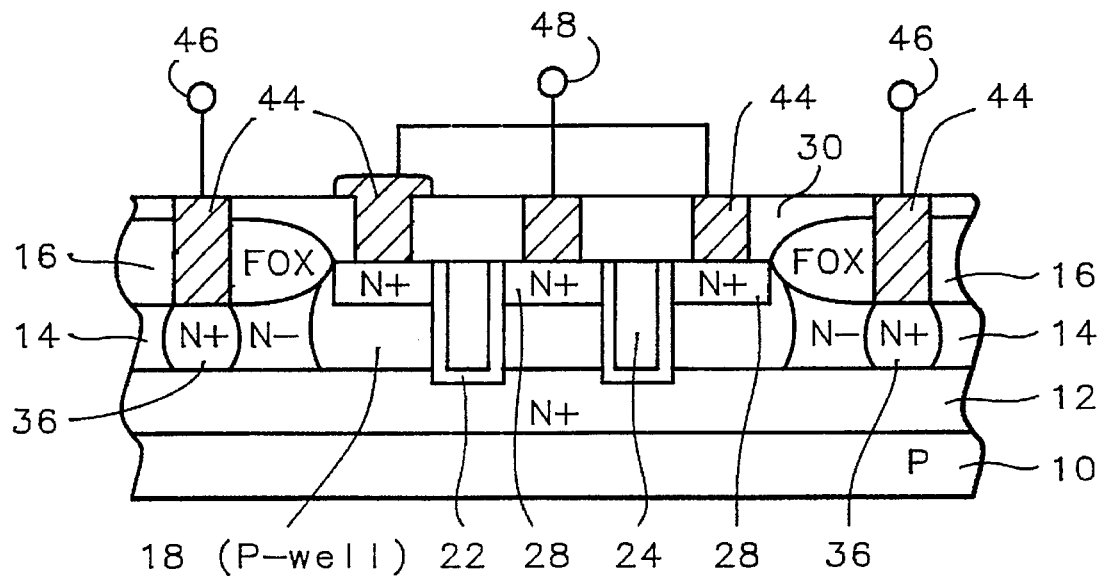
FIG. 12A is a cross-section representation of a completed integrated circuit according to the first preferred embodiment of the present invention.
Figure 12B:
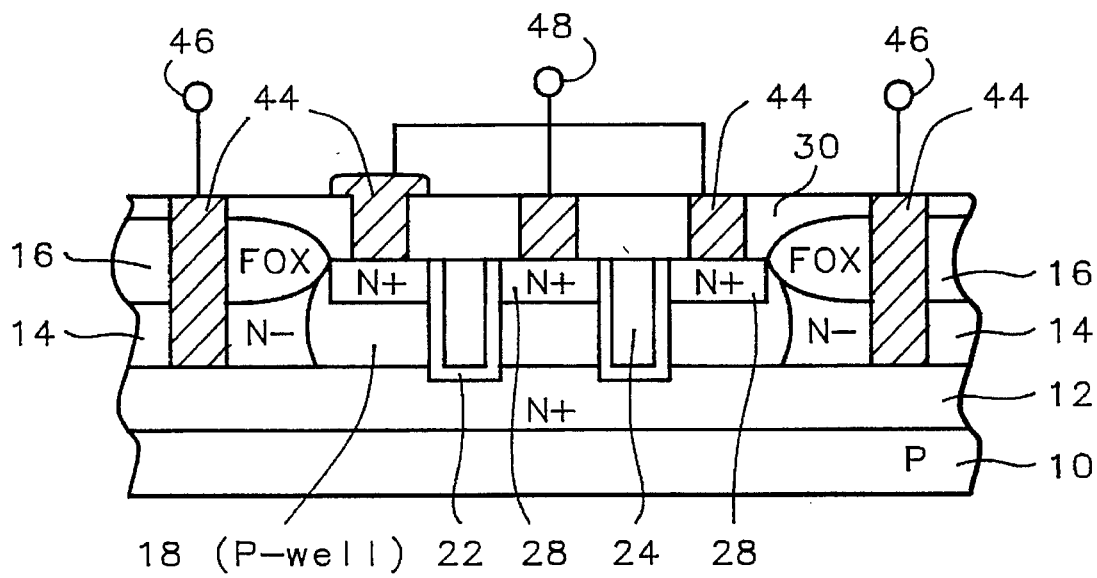
FIG. 12B is a cross-section representation of a completed integrated circuit according to the second preferred embodiment of the present invention.

Selective tungsten CVD deposition 44 and etchback is used to fill the trenches 32 and 42 to complete the source and drain contacts, as shown in FIG. 12A in the first alternative and FIG. 12B in the second alternative. Interconnections 46 and 48 are formed between the source and drain regions, respectively, to complete formation of the vertical channel device integrated circuit.

The device formed by the method of the present invention employs vertical channels and buried source junction. Source contacts are planned at the surface of the field oxide regions so as to reduce the size of the active area. This results in nearly a 30% decrease in layout and chip size.

The vertical channel device integrated circuit of the present invention illustrated in FIGS. 12A and 12B comprises a semiconductor substrate 10 of a first conductivity type, a buried source region 12 having a second conductivity type opposite the first conductivity type formed on top of the semiconductor substrate, an epitaxial layer 14 of the second conductivity type formed overlying the buried source region wherein the epitaxial layer has a dopant concentration less than the dopant concentration of the buried source region, a well region 18 of the first conductivity type formed within the central portion of the epitaxial layer wherein the well region defines the active region of the integrated circuit, field oxide regions 16 formed in and on the outer edges of the epitaxial layer, a top planarized layer 30 of silicon oxide overlying the field oxide regions and the well region, polysilicon-filled trenches 24 extending through the well region and contacting buried source region 12, drain regions 28 of the second conductivity type within the top surface of the well region and between the polysilicon-filled trenches, first tungsten plug-filled trenches 44 through the planarized silicon oxide layer contacting the drain regions 28, second tungsten plug-filled trenches 44 through the field oxide regions 16 contacting the buried source region 12, and interconnections 46 and 48 between the source and drain regions.

FIG. 12A illustrates the first alternative connection to the buried source region as described with reference to FIGS. 10A and 10B. Tungsten plug-filled trenches 44 extend to the epitaxial layer 14. Heavily-doped region 36 has the same dopant concentration as the underlying buried source region 12 and hence provides connection to the buried source region.

FIG. 12B illustrates the second alternative connection to the buried source region 12 as described with respect to FIG. 10C. The tungsten plug-filled trenches 44 extend through the field oxide regions 16 and the underlying epitaxial layer 14 to the buried source region 12. With this alternative, the tungsten plug 44 makes a direct connection to the buried source region 12.

While the invention has been particularly shown and described with reference to the preferred embodiments thereof, it will be understood by those skilled in the art that various changes in form and details may be made without departing from the spirit and scope of the invention.

What is claimed is:

1. A vertical channel device integrated circuit comprising:
   a semiconductor substrate of a first conductivity type;
   a buried source region having a second conductivity type opposite said first conductivity type overlying said semiconductor substrate;
   an epitaxial layer of said second conductivity type overlying said buried source region wherein said epitaxial layer has a dopant concentration less than the dopant concentration of said buried source region;
   a well region of said first conductivity type within the central portion of said epitaxial layer wherein said well region defines the active region of said integrated circuit;
   field oxide regions in and on the outer edges of said epitaxial layer;
   a top planarized layer of silicon oxide overlying said field oxide regions and said well region;
   gate oxide lined trenches extending through said well region and contacting said buried source region;
   polysilicon gate electrodes within said gate oxide lined trenches;
   drain regions of said second conductivity type within the top surface of said well region and between said gate oxide lined trenches;
   first tungsten plug-filled trenches through said planarized silicon oxide layer contacting said drain regions; and
   second tungsten plug-filled trenches through said field oxide regions contacting said buried source region.

2. A device according to claim 1 wherein said vertical channel device is an NMOS device and wherein said first conductivity type is P and said second conductivity type is N.

3. A device according to claim 1 wherein said vertical channel device is a PMOS device and wherein said first conductivity type is N and said second conductivity type is P.

4. A device according to claim 1 wherein said buried source region has a dopant concentration of between about 1 E 15 to 1 E 16 atoms/cm$^3$.

5. A device according to claim 1 wherein said epitaxial layer has a thickness of between about 2000 to 4000 Angstroms and a dopant concentration of between about 1 E 11 to 1 E 12 atoms/cm$^3$.

6. A device according to claim 2 wherein said well region is a P-well having a dopant concentration of between about 5 E 12 to 5 E 13 atoms/cm$^3$.

7. A device according to claim 3 wherein said well region is an N-well having a dopant concentration of between about 5 E 12 to 5 E 13 atoms/cm$^3$.

8. A device according to claim 1 wherein said second tungsten-plug filled trenches extend through said field oxide regions and said underlying epitaxial layer to said buried source region.

9. A device according to claim 1 wherein said second tungsten-plug filled trenches extend through said field oxide regions to said underlying epitaxial layer and wherein implanted regions in said epitaxial layer having the same conductivity type as said buried source region connect said second tungsten plug-filled trenches to said buried source region.

10. A vertical channel integrated circuit comprising:
    a semiconductor substrate having a first doped layer of a first conductivity type;
    a buried source/drain region having a second conductivity type opposite said first conductivity type overlying said first doped layer;
    a second doped layer of said second conductivity type overlying said buried source/drain region;
    a well region of said first conductivity type within a portion of said second doped layer;
    a layer of silicon oxide overlying said well region;
    trenches having walls extending through said well region to said buried source/drain region;
    a gate insulator layer covering said walls of said trenches
    polysilicon gate electrodes within said trenches, said polysilicon gate electrodes separated from said buried source/drain region by said gate insulator layer;
    source/drain regions of said second conductivity type within said well region;
    conducting regions extending through said silicon oxide layer and contacting said source/drain regions of said second conductivity type within said well region; and
    a conductor-filled trench extending to electrically contact said buried source/drain region.

11. The device of claim 10, comprising:
    a plurality of source/drain regions of said second conductivity type within said well region.

12. A device according to claim 10 wherein said vertical channel device is an NMOS device and wherein said first conductivity type is P and said second conductivity type is N.

13. A device according to claim 12 wherein said well region has a P-type dopant concentration of between about 5 E 12 to 5 E 13 atoms/cm$^3$.

14. A device according to claim 10 wherein said vertical channel device is a PMOS device and wherein said first conductivity type is N and said second conductivity type is P.

15. A device according to claim 14 wherein said well region is an N-well having a dopant concentration of between about 5 E 12 to 5 E 13 atoms/cm$^3$.

16. A device according to claim 10 wherein said buried source region has a dopant concentration of between about 1 E 15 to 1 E 16 atoms/cm$^3$.

17. A device according to claim 10 wherein said layer of said second conductivity type overlying said buried source/drain region is an epitaxial layer.

18. A device according to claim 10, wherein said buried source/drain region is common to said plurality of source/drain regions of said second conductivity type within said well region.

* * * * *